United States Patent
Ahmed

(10) Patent No.: US 9,614,509 B1
(45) Date of Patent: Apr. 4, 2017

(54) INTERNAL/EXTERNAL CLOCK SELECTION CIRCUIT AND METHOD OF OPERATION

(71) Applicant: SEMICONDUCTOR COMPONENTS INDUSTRIES, LLC, Phoenix, AZ (US)

(72) Inventor: Abdullah Ahmed, Scarborough (CA)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/181,076

(22) Filed: Jun. 13, 2016

(51) Int. Cl.
| | |
|---|---|
| H03K 3/00 | (2006.01) |
| H03K 5/15 | (2006.01) |
| H03B 5/32 | (2006.01) |
| H03K 5/00 | (2006.01) |

(52) U.S. Cl.
CPC ............. H03K 5/15 (2013.01); H03B 5/32 (2013.01); H03K 5/00006 (2013.01)

(58) Field of Classification Search
CPC ... H03L 7/24; H03K 5/19; H03K 5/15; H03B 5/32
USPC ......... 327/291–299; 331/158, 160, 182, 183, 331/175, 116 R, 116 FE, 108 D
See application file for complete search history.

(56) References Cited

U.S. PATENT DOCUMENTS

| | | | | |
|---|---|---|---|---|
| 4,358,742 | A * | 11/1982 | Ferriss | H03L 5/00 331/108 D |
| 5,696,469 | A * | 12/1997 | Meany | H03K 3/0307 331/108 D |
| 6,121,849 | A * | 9/2000 | McCollough | H03L 3/00 331/1 R |
| 6,194,940 | B1 | 2/2001 | Hunter et al. | |
| 8,324,978 | B2 * | 12/2012 | Loeda | H03B 5/04 331/116 FE |
| 9,065,460 | B1 * | 6/2015 | Carnu | G06F 1/04 |
| 2003/0122629 | A1 * | 7/2003 | Fulton | H03B 5/32 331/158 |
| 2006/0071729 | A1 * | 4/2006 | Cetin | G06F 1/04 331/158 |

* cited by examiner

*Primary Examiner* — Lincoln Donovan
*Assistant Examiner* — Thomas Skibinski
(74) *Attorney, Agent, or Firm* — Conley Rose, P.C.

(57) ABSTRACT

A clock circuit includes an amplifier, an electrical supply, a feedback circuit, and a comparator. The amplifier has an input node and an output node that are coupled to a crystal to provide an internal clock signal on the output node at a specified frequency. The electrical supply source provides electrical power to the amplifier at a specified input voltage. The feedback circuit is coupled between the input node and the output node, and forms a low pass filter for attenuating the internally generated clock signal on the input node. The feedback circuit biases the input node at a direct current (DC) voltage level that is biased to be less than the specified input voltage. When an external clock signal is applied at the output node, the comparator generates a digital clock signal according to the external clock signal, and when no external clock signal is applied at the output, the comparator generates the digital clock signal according to the internal clock signal.

20 Claims, 5 Drawing Sheets

US 9,614,509 B1

INTERNAL/EXTERNAL CLOCK SELECTION CIRCUIT AND METHOD OF OPERATION

TECHNICAL FIELD

Aspects of the present disclosure relate to voltage regulators and, in particular, to an internal/external clock selection circuit and method of operation.

BACKGROUND

Piezoelectric crystals are used extensively in oscillator circuits owing principally to their stable and predictable frequencies of oscillation. In many cases, piezoelectric crystal based oscillators are used with processor circuits and/or other circuits requiring accurate clock signals due to their simplicity of design and relatively low parts count. For example, a pierce crystal oscillator, which is a type of piezoelectric crystal based oscillator, is usually implemented on small processor designs (e.g., embedded processor applications, system-on-a-chip (SOC), etc.) in which most of the necessary components of the oscillator are integrally formed on the same monolithic substrate that other components are formed. Such a processor design allows designers to realize applications with relatively low cost, while providing a system that is accurately timed, and is stable over wide ranges of operating conditions.

SUMMARY

According to one aspect, a clock circuit includes an amplifier, an electrical supply, a feedback circuit, and a comparator. The amplifier has an input node and an output node that are coupled to a crystal to provide an internal clock signal on the output node at a specified frequency. The electrical supply source provides electrical power to the amplifier at a specified input voltage. The feedback circuit is coupled between the input node and the output node, and forms a low pass filter for attenuating the internally generated clock signal on the input node. The feedback circuit biases the input node at a direct current (DC) voltage level that is biased to be less than the specified input voltage. When an external clock signal is applied at the output node, the comparator generates a digital clock signal according to the external clock signal, and when no external clock signal is applied at the output, the comparator generates the digital clock signal according to the internal clock signal.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same parts throughout the different views. The drawings depict only typical embodiments of the present disclosure and, therefore, are not to be considered limiting in scope.

DETAILED DESCRIPTION

Figure 1:
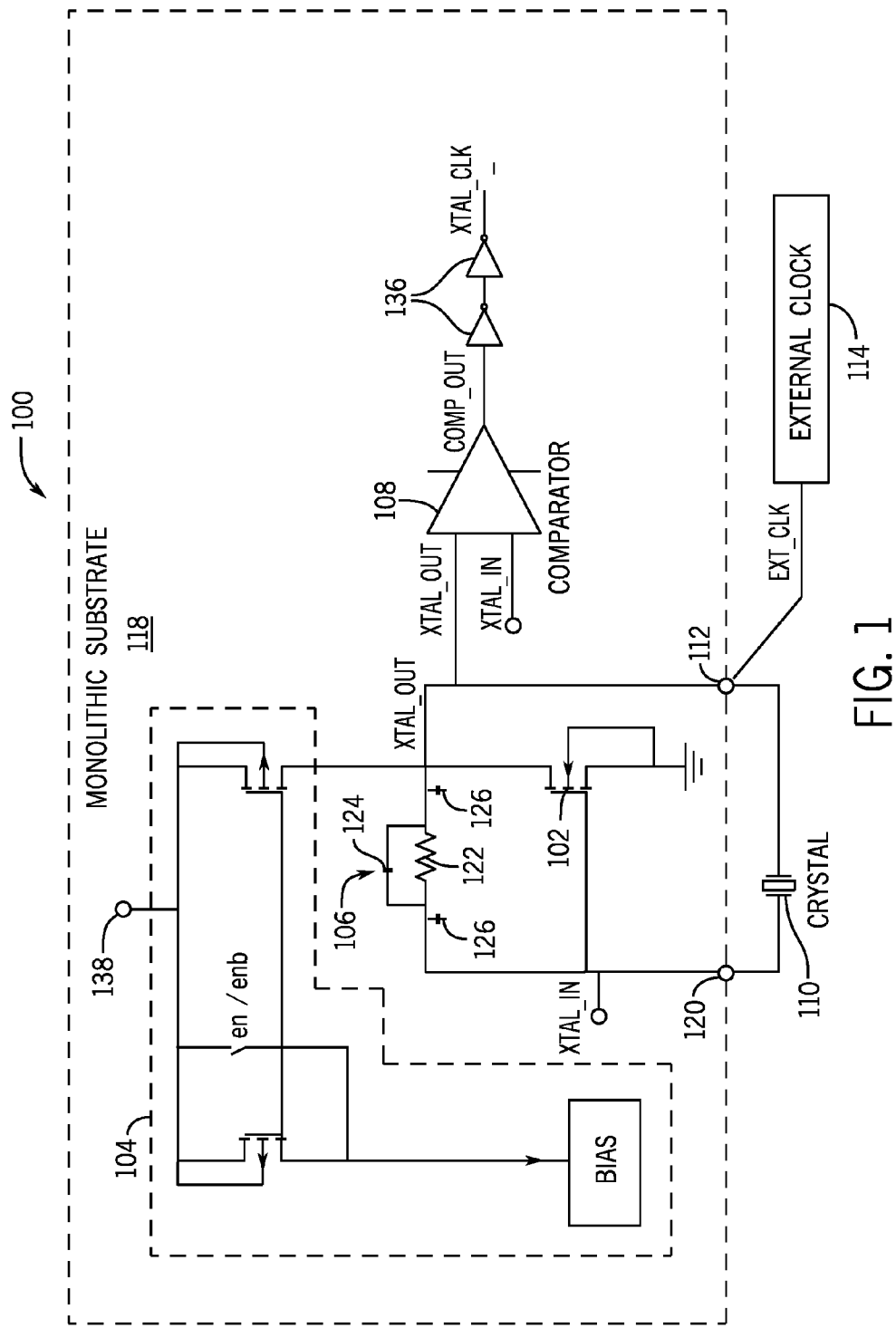
FIG. 1 illustrates an example clock circuit according to one embodiment of the present disclosure.

Embodiments of the present disclosure provide a clock circuit that can be implemented on a monolithic substrate for alternatively selecting between an internal clock signal or an external clock signal to provide a digital clock signal for use by other components of the monolithic substrate. The internal clock signal is generated in a manner so that, when the external clock signal is applied at an existing node (e.g., pin) of the clock circuit, the external clock signal may be consistently and precisely detected so that the clock circuit may select the external clock signal as its reference. By detecting the presence of the external clock signal using an existing node, the clock circuit may be realized on a monolithic substrate without necessitating the use of any additional pins, which is often a scarce commodity in many currently implemented monolithic chip designs.

Many conventional monolithic chip designs benefit from the flexibility provided by receiving their timing internally (e.g., from a clock on the chip) and externally (e.g., received from an off-chip clock). For example, some monolithic substrate based designs may be implemented in low power applications where the components of the monolithic substrate should be able to continue operation even when other circuitry, which may include external timing circuitry, is shut down periodically to reduce power usage. As such, the monolithic substrate should include an internally generated clock that continues to provide timing for the components of the monolithic substrate even when the externally generated clock signal is no longer available.

Nevertheless, conventionally available clock circuits have certain drawbacks that have limited this mode of operation. For example, some conventional clock circuits that have been implemented on monolithic substrates have often required the use of one or more additional pins to alternatively select between an internal clock signal and an externally supplied clock signal; but in many cases, this option may not be feasible when overall pin count of the monolithic substrate is limited. Other conventional clock circuits have used automatic gain control (AGC) schemes, but these AGC schemes are often void of any active direct current (DC) bias such that when the external clock signal is applied, the signals of the internal clock circuit are often clamped to electrical static discharge (ESD) circuitry at a voltage rail (e.g., input voltage supply, ground, etc.) of the monolithic substrate, a condition that often damages the monolithic substrate and/or reduces its overall reliability. Certain conventional clock circuits have used schemes involving driving both phases of an external clock signal on the crystal oscillator pins, but these schemes often require extra external circuitry, which is often power consuming. Additionally, other conventional clock circuits have involved the use of a high impedance switch on the output of the internal clock, which is difficult to drive due to its low impedance when the internal clock is on, and in high impedance when off, which may be difficult to detect.

FIG. 1 illustrates an example clock circuit 100 that may provide a solution to these problems, and other problems associated with conventional clock circuits that use internal clock signals as well as external clock signals. The clock circuit 100 includes an amplifier 102, an electrical supply source 104, a feedback circuit 106, a comparator 108, and a piezoelectric crystal 110. Nevertheless, it should be appreciated that the clock circuit 100 may include additional components, fewer components, or different components without deviating from the spirit and scope of the present disclosure.

The amplifier 102 includes a transistor that amplifies an input signal (xtal_in) to generate an output signal (xtal_out) wherein the input signal (xtal_in) is generated by the feedback circuit 106 that filters and conditions the output signal (xtal_out) to provide the input signal (xtal_in). The amplifier 102, electrical supply source 104, feedback circuit 106, and piezoelectric crystal 110 form an internal clock that generates an internal clock signal (xtal_clk). The clock circuit 100 is configured such that, when an external clock signal (ext_clk) is applied at an output node 112 via an external clock 114, the comparator 108 generates a digital clock signal (comp_out) according to the external clock signal, and when no external clock signal (ext_clk) is applied at the output node 112, the comparator 108 generates the digital clock signal (comp_out) according to an internal clock signal generated by the combined interaction of the piezoelectric crystal 110, amplifier 102, and feedback circuit 106. Additionally, one or more buffer gates 136 may be provided to generate a second digital clock signal (xtal_clk) by receiving the digital clock signal (comp_out) and generating the second digital clock signal (xtal_clk), which may provide a buffered signal relative to the digital clock signal (comp_out). As will be described in detail herein below, the clock circuit 100 may detect and transition between the external clock signal from the external clock 114 and the internal clock signal without the need for any additional circuitry or nodes to the clock circuit 100.

According to one embodiment, the electrical supply source 104, the amplifier 102, the feedback circuit 106, and the comparator 108 are integrally formed on a single monolithic substrate 118, while the piezoelectric crystal 110 and external clock 114 are external to the monolithic substrate 118. Such an arrangement may be beneficial for small, lightweight applications where relatively accurate timing may be used by alternatively receiving timing signals from an external clock source and internally generating the timing signal when the external clock source is not available, such as when the external timing source is shut down to preserve power. For example, the monolithic substrate 118 may comprise other components, such as an embedded processor of a hearing aid that may alternatively receive an external timing signal from a communication circuit for synchronizing operation with the communication circuit, and may continue operation using its internal timing source when the communication circuit is shut down to preserve electrical power. Nevertheless, it is contemplated that the clock circuit 100 may be embodied in other specific forms without deviating from the spirit and scope of the present disclosure. For example, it is contemplated that the clock circuit 100 may be implemented for use with other applications (e.g., generic logic circuits), and/or be made mostly or entirely with discrete components (e.g., without being integrated with other components on a monolithic substrate).

The amplifier 102 amplifies and inverts an input signal (xtal_in) at an input node 120 to provide the output signal (xtal_out) at output node 112 having a frequency at or approximating a resonant frequency of the piezoelectric crystal 110. In one embodiment, the piezoelectric crystal 110 may have a nominal resonant frequency of approximately 32 Kilohertz. Clocks having a resonant frequency of 32 Kilohertz are often used by real-time clocks. In order to alternatively switch between the internal clock and the external clock 114, the feedback circuit 106 functions as a low pass filter with a high frequency cut-off point such that the input signal (xtal_in) is at least partially attenuated. That is, the feedback circuit 106 may be configured with a low pass filter having a high frequency cut-off point that is at least slightly lower than the resonant frequency of the piezoelectric crystal 110 such that the input signal (xtal_in) is attenuated relative to the output signal (xtal_out), thus forming a direct current (DC) bias on the input signal (xtal_in) that maintains the input signal (xtal_in) at a direct current (DC) voltage level, which is biased to be less than an input voltage 138 (e.g., Vcc) under various loading conditions that may be caused by the external clock 114. To accomplish this functionality, the feedback circuit 106 may include a resistor-capacitor (RC) circuit having a resistor 122 in which the resistor has a parasitic capacitance 124 that functions as the capacitor portion of the RC circuit and may also include one or more parasitic load capacitors 126.

In one embodiment, the resistor 122 is made of polysilicon. The polysilicon resistor inherently possesses a parasitic capacitance that forms a capacitor portion 124 of the RC circuit. The polysilicon resistor may have a resistance of several Mega-Ohms (e.g., 1 to 5 MΩ) for achieving high gain in the feedback loop of the amplifier 102 and feedback circuit 106 that generates the internal clock signal (comp_out). Nevertheless, due to the inherent parasitic capacitance of the polysilicon resistor, the feedback resistor forms a RC low pass filter. For example, a 1 to 5 MΩ polysilicon resistor formed using a typical monolithic substrate fabrication process will produce a parasitic capacitance of approximately 1 Pico-Farad (pF). When such a polysilicon resistor is implemented with a piezoelectric crystal 110 with a nominal resonant frequency of 32 Kilo-Hertz, the input signal (xtal_in) should be attenuated to a sufficient amount to provide a DC biased reference voltage to the input of the amplifier 102 for adequately detecting the external clock signal (ext_clk) from the external clock 114. In other cases, it should be appreciated that other feedback circuits configured with other equivalent RC circuits may be implemented with resistors having other values without departing from the spirit and scope of the present disclosure.

The feedback circuit 106 attenuates the output signal (xtal_out) to form the input signal (xtal_in), which is smaller in amplitude than the output signal (xtal_out), while forming a direct current (DC) bias that is biased to be less than the voltage level of the electrical supply circuit 104. That is, the input signal (xtal_in) forms a DC reference signal having periodic ripples with a frequency that may be essentially the same as the external clock signal. The amplitude of the ripple is based on the bandwidth (BW) of the RC filter and the frequency of the external clock. The input signal (xtal_in) will be one input to the crystal oscillator comparator and the full logic signal of the external clock will become the second input to the comparator circuit. The comparator will use the input signal (xtal_in) as a differential voltage to be able to detect the external clock which is more than sufficient for resolving the output to be a full logic level clock signal as the external clock signal.

The external clock signal (ext_clk) may be provided, by the external clock 114, on the output node 112 to provide a clock source for the clock circuit 100 whether the crystal 110 is connected or not connected. That is, the monolithic substrate may be provided with a digital clock signal output using the external clock even if no piezoelectric crystal 110 is provided to enable the internal clock signal. For example, the external clock 114 may be used to provide a digital clock signal even when no crystal 110 is provided.

Figure 2:
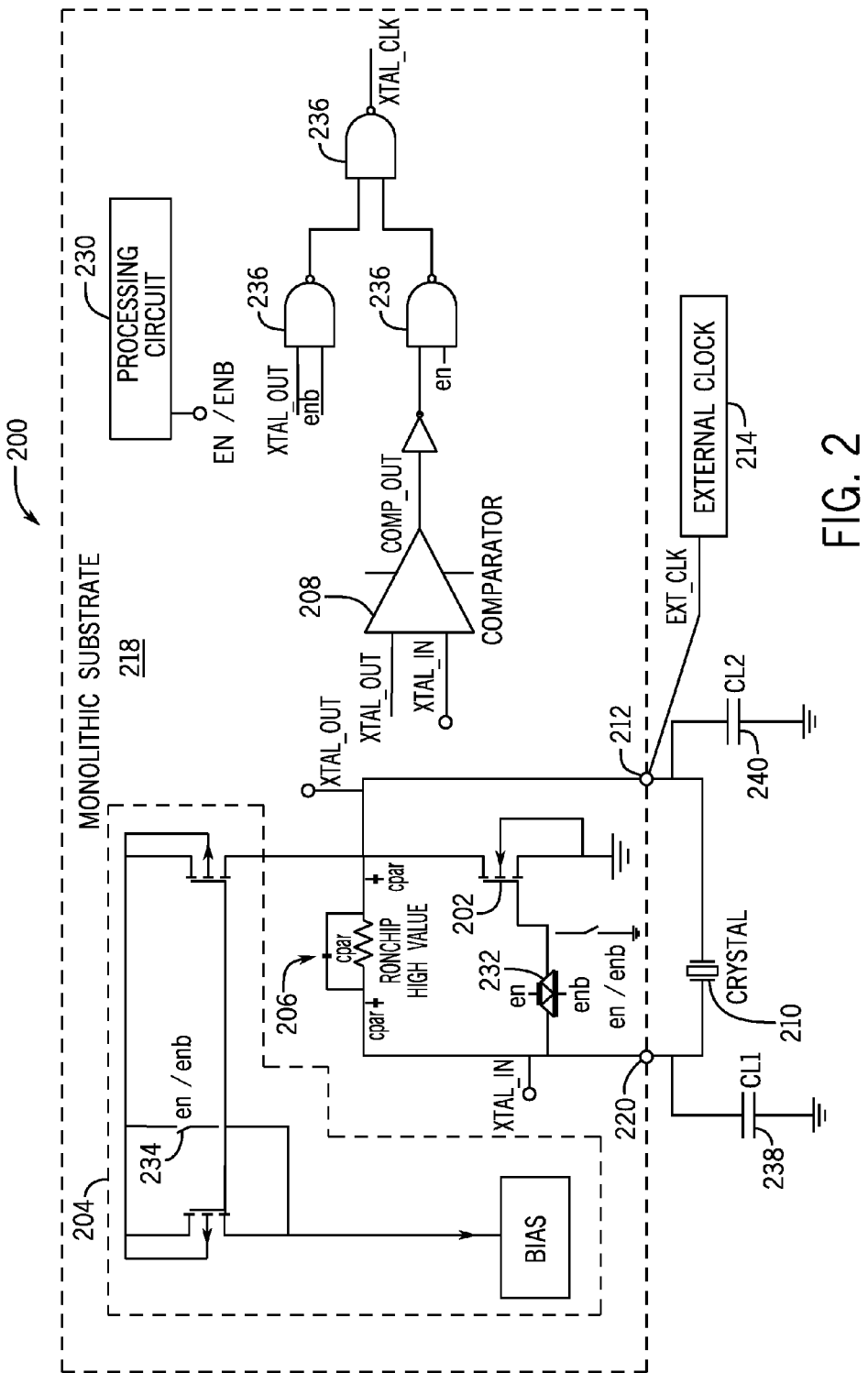
FIG. 2 illustrates another example clock circuit that includes enable circuitry for enabling and disabling the internal clock according to one embodiment of the present disclosure.

FIG. 2 illustrates another example clock circuit 200 according to one embodiment of the present disclosure. The clock circuit 200 has an amplifier 202, an electrical supply source 204, a feedback circuit 206, a comparator 208, and a piezoelectric crystal 210 that are similar in design and construction to the amplifier 102, electrical supply source 104, feedback circuit 106, comparator 108, and piezoelectric crystal 110 of the clock circuit 100 of FIG. 1. The clock circuit 200 differs, however, in that it includes an onboard processing circuit 230 that controls an enable signal (en) and a disable signal (enb) for alternatively enabling and disabling, respectively, the internal signal generated by the internal clock for reducing power usage when the internal clock is not being used. The disable signal (enb) is the complement of the enable (en) signal.

The clock circuit 200 may be integrally fabricated with a processing circuit 230 on a single monolithic substrate 218 that is used as a digital signal processing component of a portable device in which the processing circuit 230 is also used to digitally process audio signals received from a microphone or other sound generating device. The processing circuit 230 may include at least one processor that executes instructions stored in at least one memory (e.g., computer readable media) for performing the various features of the processing circuit 230 described herein. In other embodiments, the processing circuit 230 may be embodied in other specific forms, such as discrete and/or integrated analog circuitry, field programmable gate arrays (FPGAs), application specific integrated circuitry (ASICs), or any combination thereof. Additionally, the processing circuit 230 may be omitted if manual operation of the enable (en) or disable (enb) signals are desired.

The clock circuit 200 may include a transmission gate 232 and a switch 234 (e.g., a transistor switch) to disable the feedback path through the amplifier 202 and the bias signal through the electrical supply source 204, respectively. The clock circuit 200 may also include several NAND gates 236 for selectively applying either the internal clock signal or the external clock signal to the digital output signal (xtal_clk). Thus, after an external clock signal is applied to the output node 212, the processing circuit 230 may activate the enable node to disable operation of the internal clock circuit for, among other things, reducing power draw caused by the generally unnecessary operation of the internal clock circuit.

Additionally, an external input node capacitor 238 and/or an external output node capacitor 240 may be coupled to the input node (xtal_in) and output node (xtal_out), respectively, to further tailor the attenuation of the input signal (xtal_in). That is, one or more additional load capacitors may be added to further tailor the low frequency cut-off point relative to the resonant frequency of the piezoelectric crystal 110. For example, one or more load capacitors may be added to tailor the resonant frequency of the internal clock signal.

Figure 3:
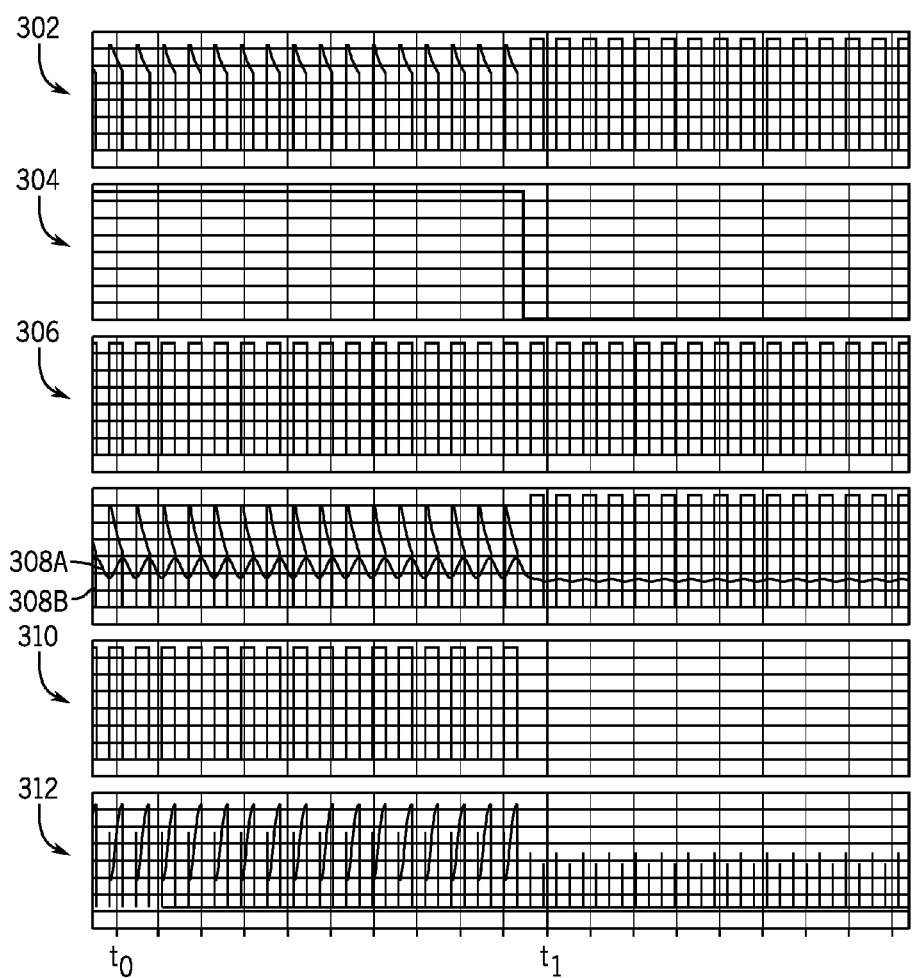
FIG. 3 illustrates example waveforms of various signals generated by the clock circuit to progress from obtaining its timing source from the internal clock to the external clock according to one embodiment of the present disclosure.

FIG. 3 illustrates example waveforms of various signals generated by the clock circuit 200 to progress from obtaining its timing source from the internal clock to the external clock 214 according to one embodiment of the present disclosure. In particular, waveform 302 illustrates the external clock signal (ext_clk) provided by the external clock 114, waveform 304 illustrates the enable signal (en) generated by the processing circuit 230, waveform 306 illustrates the digital clock signal (xtal_clk) generated by the NAND gates 236, waveforms 308a and 308b illustrate the input signal (xtal_in) and output signal (xtal_out) generated across the piezoelectric crystal 210, waveform 310 illustrates the comparator output signal (comp_out) generated by the comparator 208, and waveform 312 illustrates the supply current used by the clock circuit 100.

Initially at time $t_0$, the external clock 214 is coupled to the output node (xtal_out) of the clock circuit 200. Because the input signal (xtal_in) is attenuated and has a DC component approximating that of one-half (½) of the supply voltage, the comparator 208 can adequately detect the external clock signal to generate the comparator output signal (comp_out) 310 with the same phase as the external clock signal. Nevertheless, at time $t_1$ (e.g., 0.9 milliseconds after time $t_0$) however, the enable signal waveform 304 has been activated so that the clock circuit 100 derives its timing from the external clock 214 while the internal clock is shut down to preserve power. For example, the comparator output (comp_out) waveform 310 goes to a steady state logic low level while the input signal (xtal_in) waveform 308a goes to a steady state mid-range quiescent voltage level. Additionally as shown, the current draw as exhibited by waveform 312 is reduced from approximately 179 micro-Amperes to approximately 519 nano-Amperes. Nevertheless, it should be understood that other embodiments of the clock circuit 200 as described herein may exhibit differing timing, amplitude, and current usage levels than those specific timing, amplitude, and current usage levels shown and described herein without deviating from the spirit and scope of the present disclosure.

Figure 4:
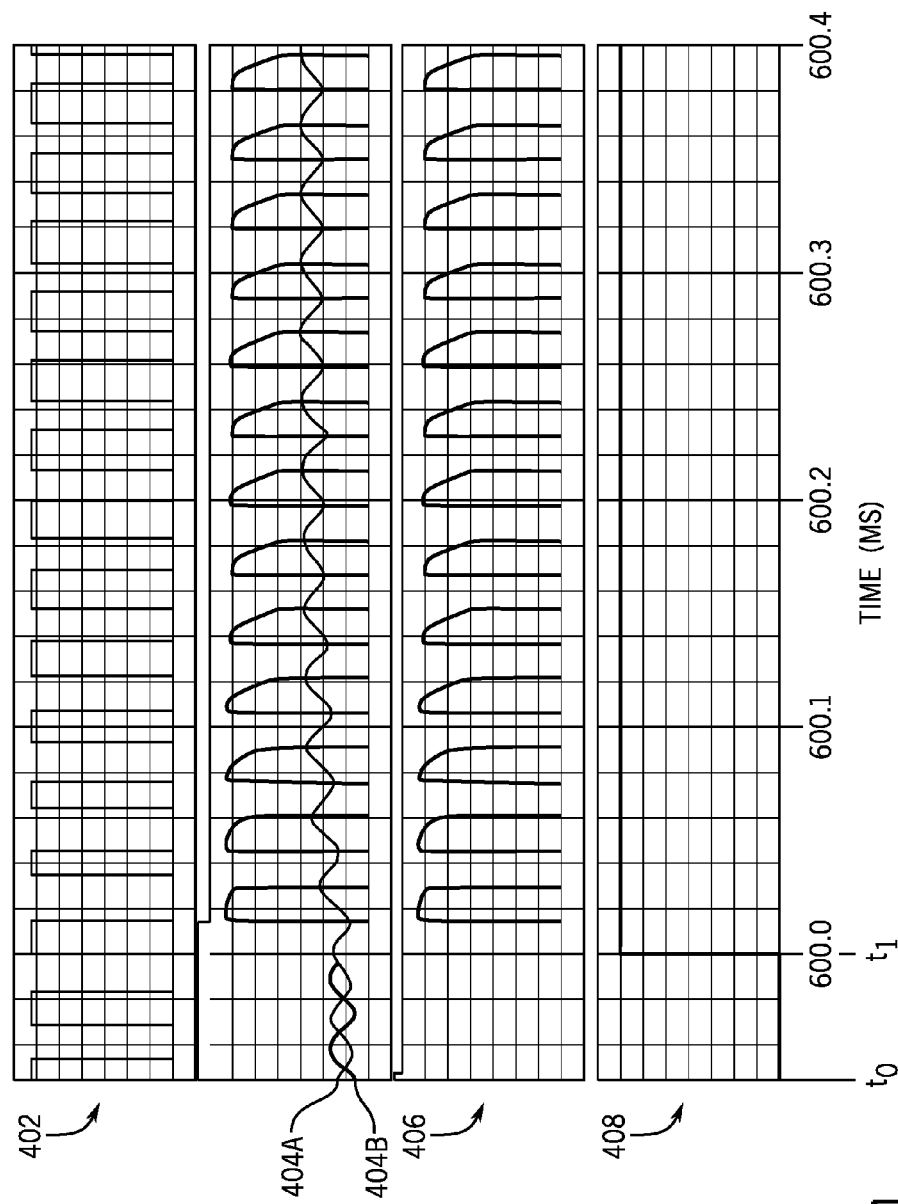
FIG. 4 illustrates example waveforms of the signals generated by various components of the clock circuit to progress from obtaining its timing from the external clock to obtaining its timing from the internal clock according to one embodiment of the present disclosure.

FIG. 4 illustrates example waveforms of the signals generated by various components of the clock circuit 200 to progress from obtaining its timing from the external clock to obtaining its timing from the internal clock according to one embodiment of the present disclosure. In particular, waveform 402 illustrates the digital clock signal (xtal_clk) generated by the NAND gates 236, waveforms 404a and 404b illustrate the input signal (xtal_in) and output signal (xtal_out) generated across the piezoelectric crystal 210, waveform 406 illustrates the external clock signal (ext_clk) generated by the external clock 114, and waveform 408 illustrates the enable signal (en) generated by the processing circuit 230.

At time $t_0$, the enable signal 408 (enb) is low (e.g., active lo) so that the clock circuit 200 derives its timing from the external clock 214. During this time, the internal clock is inactive such that the input signal (xtal_in) waveform 404a and output signal (xtal_out) waveform 404b have a steady-state mid-range quiescent voltage level.

Figure 5:
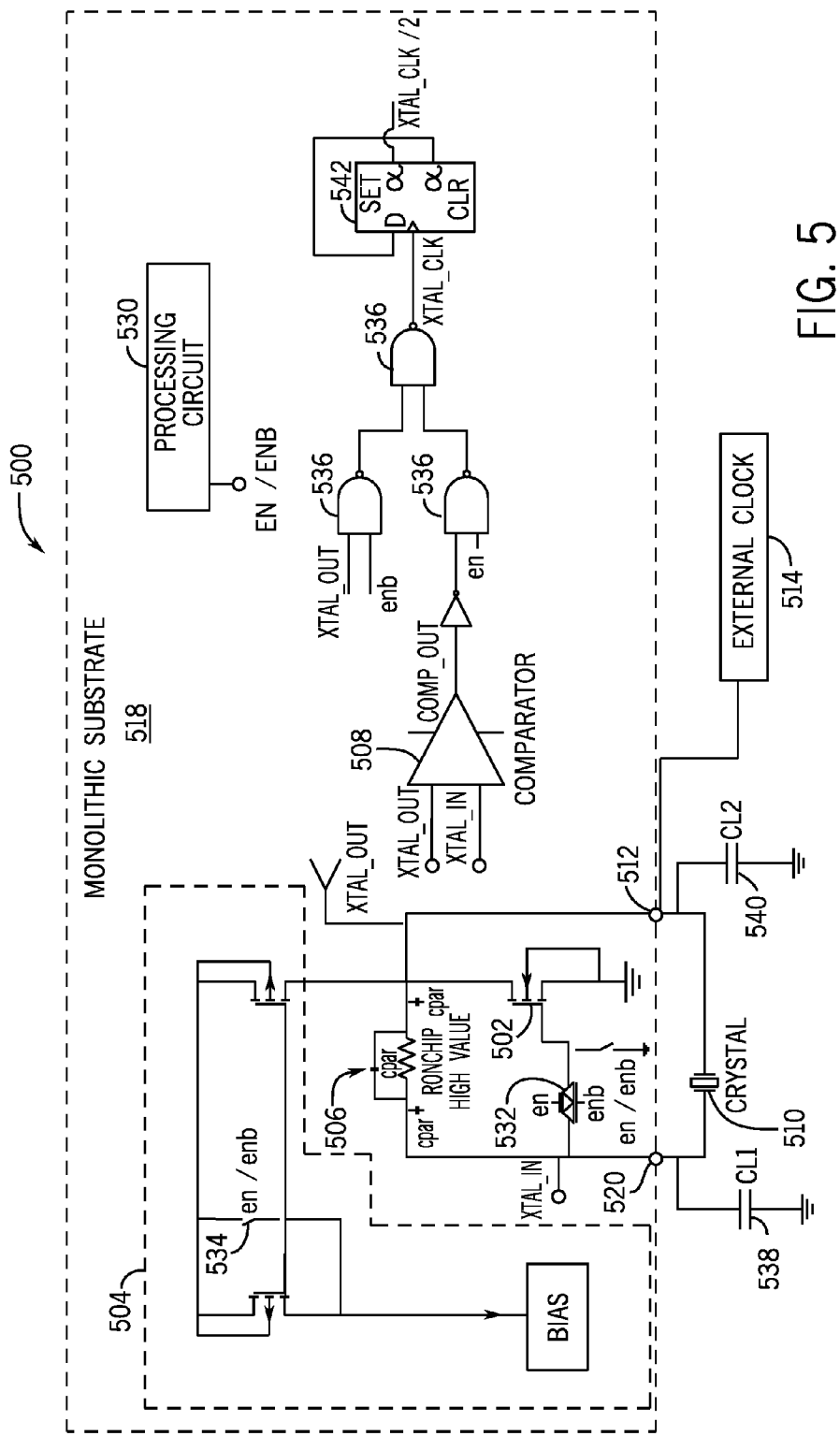
FIG. 5 illustrates another example clock circuit that includes a divide-by-two circuit according to one embodiment of the present disclosure.

At time $t_1$, the enable signal (en) is deactivated so that the clock circuit 200 reverts to obtaining its timing from the internal clock to the external clock 214. Clock 406 is the output of the NAND gate 236 where the (enb) is provided by the processing circuit 230. This configuration may provide a relatively glitch free transition by inhibiting transition until the internal clock has stabilized. As such, the amplifier 202, electric supply source 204, and feedback circuit 206 are activated as shown by waveforms 404a and 404b. In one embodiment, after the enable signal (en) waveform 408 is disabled, the external clock signal (ext_clk) may be decoupled from the output signal (xtal_out) using a high impedance (hi-Z) circuit or other decoupling means FIG. 5 illustrates another example clock circuit 500 according to one embodiment of the present disclosure. The clock circuit 500 has an amplifier 502, an electrical supply source 504, a feedback circuit 506, a comparator 508, a piezoelectric crystal 510, transmission gate 532, switch 534, NAND gates 536, an input node capacitor 538, an output node capacitor 540, and a processing circuit 530 that are similar in design and construction to the amplifier 202, electrical supply source 204, feedback circuit 206, comparator 208, piezoelectric crystal 210, transmission gate 232, switch 234, NAND gates 236, input node capacitor 238, external output node capacitor 240, and a processing circuit 230 of the clock circuit 200 of FIG. 2. The clock circuit 500 differs, however, in that it includes a D flip-flop 542 that functions as a divide-by-2 circuit for generating an output clock signal (xtal_clk/2) that has an effective frequency half that of the output clock signal (xtal_clk). Nevertheless, the clock circuit 500 may have other types of circuitry for generating an output clock signal having a 50 percent duty cycle without deviating from the spirit and scope of the present disclosure.

The D flip-flop 542 (e.g., divide-by-2 circuit), or other suitable stateful device, may be useful for generating an output clock signal that has a 50 percent duty cycle. For example, as shown in FIG. 4, when the enable signal (en) is deactivated, the output digital output signal (xtal_clk) may temporarily generate pulses that are not at a 50 percent duty cycle. As can be seen, when the enable signal (en) waveform 408 is deactivated, the input signal (xtal_in) waveform 404a and output signal (xtal_out) waveform 404b require several clock cycles to achieve their steady-state values.

For example, the DC bias on the input signal (xtal_in) waveform 404a is approximately 40 percent of the supply voltage prior to the enable signal waveform 408 being deactivated, while the DC bias is approximately 50 percent of the supply voltage approximately 102 milli-seconds after the enable signal waveform 408 has been deactivated. Therefore, during this transient period of time, the pulses of the digital output signal waveform (xtal_clk) 402 may exhibit a reduced pulse width while at a logic hi level such that the digital output signal waveform 402 may have a duty cycle that is less than 50 percent. Therefore, by implementing the D flip-flop 542 as a divide-by-2 circuit, a digital output signal (ext_clk) may be provided that is substantially 50 percent under all possible modes of operation of the clock circuit 500.

Although the clock circuits 100, 200, and 500 illustrate example embodiments of circuits that may be used to provide over-current protection for voltage regulators, other embodiments may have other topologies without departing from the spirit and scope of the present disclosure. For example, other embodiments may include additional components, fewer components, or different components than what is described herein. Additionally, certain components of each of the example clock circuits 100, 200, and 500 may be integrated into a monolithic circuit chip, while other components are implemented using discrete circuitry.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A clock circuit comprising:
   an amplifier having an input node and an output node that are coupled to a crystal to provide an internal clock signal on the output node at a specified frequency;
   an electrical supply source providing electrical power to the amplifier at a specified input voltage;
   a feedback circuit coupled between the input node and the output node, the feedback circuit forming a low pass filter for attenuating the internally generated clock signal on the input node; and
   a comparator having a first comparator input coupled to the output node and a second comparator input coupled to the output node,
   wherein the feedback circuit biases the input node at a direct current (DC) voltage level that is biased to be less than the specified input voltage such that:
   when an external clock signal is applied at the output node of the amplifier, the comparator generates a digital clock signal according to the external clock signal, and
   when no external clock signal is applied at the output, the comparator generates the digital clock signal according to the internal clock signal.

2. The clock circuit of claim 1, wherein the amplifier, the feedback circuit, and the comparator are formed on a monolithic substrate.

3. The clock circuit of claim 2, wherein the feedback circuit comprises a resistor-capacitor circuit having a low pass filter with a cutoff frequency below the specified frequency of the internal clock signal.

4. The clock circuit of claim 3, wherein the resistor-capacitor circuit comprises a resistor made of polysilicon, the polysilicon resistor having a parasitic capacitance that forms at least a portion of the capacitor portion of the resistor-capacitor circuit.

5. The clock circuit of claim 1, wherein the amplifier comprises a field-effect-transistor.

6. The clock circuit of claim 1, wherein the electrical supply source comprises a current mirror.

7. The clock circuit of claim 1, further comprising an enable circuit to alternatively enable or disable the internal clock signal for inhibiting transition to the internal clock signal until the internal clock has stabilized.

8. The clock circuit of claim 7, further comprising a communication circuit that is used to control the enable circuit.

9. The clock circuit of claim 1, further comprising a divide-by-2 circuit to generate a second digital clock signal with a frequency that is half of the frequency of the digital clock signal and at substantially 50 percent duty cycle.

10. A clocking method comprising:
    providing electrical power to an amplifier at a specified input voltage, wherein the amplifier has an input node and an output node that are coupled to a crystal to provide an internal clock signal on the output node at a specified frequency;

attenuating an internally generated clock signal on the input node using a feedback circuit;

when an external clock signal is applied at the output node, generating a digital clock signal according to the external clock signal using a comparator that detects the external clock signal by comparing the external clock signal against the attenuated internally generated clock signal on the input node, wherein the feedback circuit biases the input node at a direct current (DC) voltage level that is biased to be less than the specified input voltage; and when no external clock signal is applied at the output node of the amplifier, generating the digital clock signal according to the internal clock signal using the comparator.

11. The clocking method of claim 10, further comprising forming the amplifier, the feedback circuit, and the comparator on a monolithic substrate.

12. The clocking method of claim 11, wherein the feedback circuit comprises a resistor-capacitor circuit having a low pass filter with a cutoff frequency below the specified frequency of the internal clock signal.

13. The clocking method of claim 12, wherein the resistor-capacitor circuit comprises a resistor made of polysilicon, the polysilicon resistor having a parasitic capacitance that forms at least a portion of the capacitor portion of the resistor-capacitor circuit.

14. The clocking method of claim 10, wherein the amplifier comprises a field-effect-transistor.

15. The clocking method of claim 10, wherein the electrical supply source comprises a current mirror.

16. The clocking method of claim 10, further comprising applying an enable circuit to alternatively enable or disable the internal clock signal.

17. The clocking method of claim 16, further comprising controlling the enable circuit using a communication circuit.

18. The clocking method of claim 10, further comprising generating a second digital clock signal with a frequency that is half of the frequency of the digital clock signal using a divide-by-2 circuit, the second digital clock signal having a frequency that is half of the frequency of the digital clock signal and at substantially 50 percent duty cycle.

19. A clock circuit comprising:
a field-effect transistor having an input node and an output node that are coupled to a crystal to provide an internal clock signal on the output node at a specified frequency;
a current mirror providing electrical power to the field-effect transistor at a specified input voltage; and
a polysilicon resistor forming a resistor-capacitor (RC) circuit coupled between the input node and the output node, the RC circuit forming a low pass filter for attenuating the internally generated clock signal on the input node; and
a comparator having a first comparator input coupled to the output node and a second comparator input coupled to the output node, wherein the feedback circuit biases the input node at a direct current (DC) voltage level that is biased to be less than the specified input voltage such that:
when an external clock signal is applied at the output node of the amplifier, the comparator generates a digital clock signal according to the external clock signal, and
when no external clock signal is applied at the output, the comparator generates the digital clock signal according to the internal clock signal,
wherein the field-effect transistor, the current mirror, and the comparator are integrally formed on a monolithic substrate.

20. The clock circuit of claim 19, further comprising an enable circuit to alternatively enable or disable the internal clock signal for inhibiting transition to the internal clock signal until the internal clock has stabilized.

* * * * *